(12) United States Patent
Bakker

(10) Patent No.: US 9,097,993 B2
(45) Date of Patent: Aug. 4, 2015

(54) OPTICAL ELEMENT AND LITHOGRAPHIC APPARATUS

(75) Inventor: Levinus Pieter Bakker, Helmond (NL)

(73) Assignee: ASML NETHERLANDS B.V., Veldhoven (NL)

( * ) Notice: Subject to any disclaimer, the term of this patent is extended or adjusted under 35 U.S.C. 154(b) by 599 days.

(21) Appl. No.: 13/372,093

(22) Filed: Feb. 13, 2012

(65) Prior Publication Data

US 2012/0140197 A1    Jun. 7, 2012

Related U.S. Application Data

(62) Division of application No. 10/936,716, filed on Sep. 9, 2004, now Pat. No. 8,137,869.

(30) Foreign Application Priority Data

Sep. 10, 2003 (EP) ...................................... 03077850

(51) Int. Cl.
*G02B 5/18* (2006.01)
*G03F 7/20* (2006.01)

(52) U.S. Cl.
CPC ........ *G03F 7/70958* (2013.01); *G03F 7/70575* (2013.01); *G03F 7/70983* (2013.01)

(58) Field of Classification Search
None
See application file for complete search history.

(56) References Cited

U.S. PATENT DOCUMENTS

| 5,515,354 | A | 5/1996 | Miyake et al. |
| 5,726,805 | A | 3/1998 | Kaushik et al. |
| 5,928,817 | A | 7/1999 | Yan et al. |
| 6,664,554 | B2 | 12/2003 | Klebanoff et al. |
| 2002/0097385 | A1 | 7/2002 | Van Elp et al. |

FOREIGN PATENT DOCUMENTS

| EP | 1150139 A2 | 10/2001 |
| EP | 1197803 A2 | 4/2002 |

*Primary Examiner* — Daborah Chacko Davis
(74) *Attorney, Agent, or Firm* — Pillsbury Winthrop Shaw Pittman LLP

(57) ABSTRACT

An optical element includes a surface including a tilted profile having height differences, thereby providing cavities and elevations having a predetermined maximum height difference, and a transmissive layer that covers the cavities and the elevations of the optical element. A first height of the transmissive layer in the cavities is substantially equal or larger than the predetermined maximum height difference and the transmissive layer has a second height on the elevations and the second height is about 10-500 nm. The transmissive layer is enabled to optically filter incident radiation, and the optical element is a grating.

16 Claims, 3 Drawing Sheets

OPTICAL ELEMENT AND LITHOGRAPHIC APPARATUS

This application is a divisional application of U.S. patent application Ser. No. 10/936,716, filed Sep. 9, 2004, which claims priority to European Patent Application 03077850.0, filed Sep. 10, 2003, the entire contents of both of which are herein incorporated by reference.

BACKGROUND OF THE INVENTION

1. Field of the Invention

The present invention relates to an optical element and a lithographic apparatus.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of one or several dies) on a substrate (e.g. a silicon wafer) that has a layer of radiation-sensitive material (resist). In general, a single substrate will contain a network of adjacent target portions that are successively exposed. Known lithographic apparatus include steppers, in which each target portion is irradiated by exposing an entire pattern onto the target portion at once, and scanners, in which each target portion is irradiated by scanning the pattern through the projection beam in a given direction (the "scanning" direction) while synchronously scanning the substrate parallel or anti-parallel to this direction.

In a lithographic apparatus the size of features that can be imaged onto the substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation, e.g. of around 13 nm. Such radiation is termed extreme ultraviolet (EUV) or soft x-ray, and possible sources include, for example, laser-produced plasma sources, discharge plasma sources, or synchrotron radiation from electron storage rings.

In EUV lithography systems, submicron optical structures are present, facing the non-perfect vacuum. They are, for example, present on the surface of optical elements, e.g. EUV optical elements, like spectral purity filters (e.g. gratings), on reticles, and on image sensors. All these components are illuminated with EUV radiation. However, these structures get contaminated, for example, by debris particles from the radiation source or other particles that may be present in the non-perfect vacuum. For example, in a lithographic projection apparatus for EUV applications, it is necessary to prevent any stray particles or debris, that may be present in the apparatus, from reaching and becoming stuck to the reticle as they will otherwise be imaged on the wafer and can be printed in the final device. A too high level of contamination of the mask can lead to defect devices. Reticles can generally not be cleaned, or if cleanable, can only be cleaned a limited number of times.

In lithographic projection apparatus using relatively long wavelength ultraviolet radiation, particles are prevented from reaching the mask by a pellicle. A pellicle is a thin membrane transparent to the radiation used in the projection beam of the lithographic apparatus and located parallel to, but spaced from, the mask. Contaminant particles moving towards the mask contact and stick to the pellicle. To ensure that the particles stuck to the pellicle are not printed on the substrate, the pellicle is spaced from the mask by a distance greater than the depth of focus at mask level. However, state of the art and commercially available filters and pellicles are typically characterized by a relative high absorption for EUV radiation, when used in EUV applications, e.g. at 13.5 nm wavelength. Usually they also have a mechanical supporting structure consisting of a mesh of thin wires, whereby the wires also absorb EUV radiation. Hence, state of the art pellicles are not useful in EUV applications for protecting the mask.

Gratings can get contaminated too. Gratings for EUV radiation may include laminar sawtooth or square wave profiles, wherein on a mirror protrusions having a sawtooth or square wave profile, respectively, are laminarly arranged. See, for example, U.S. Pat. No. 6,678,037, the entire contents of which are herein incorporated by reference. Between such protrusions, contaminant particles may be collected, which are not easily removed.

In addition to gratings, mirrors, especially tilted multilayer stack mirrors (see for example Seely et al., Applied Optics 40, vol. 31, page 5565 (2001)), also have a profile with cavities and elevations, leading to the same problems of contamination and cleaning as mentioned above.

Further, lithographic projection apparatus may include an image sensing device, which may be mounted on the substrate table. Such an image sensing device is used to measure a mark pattern present in the patterning device, so as to determine a plane of best focus of the projection system ("lens"), lens aberrations and to align a substrate table with respect to the patterning device. Presently, an image sensor includes several separate sensors located behind detection structures that may take the form of gratings. See, for example, U.S. Pat. No. 6,747,282, the entire contents of which are herein incorporated by reference. Between these structures or protrusions contaminations may also be collected, which are not easily removed.

SUMMARY OF THE INVENTION

It is an aspect of the present invention to provide a method for protecting optical elements against contaminations, wherein the optical elements are provided with a protective surface that is easy to clean.

According to an embodiment of the present invention, a method for manufacturing and/or protecting an optical element, wherein the optical element has at least one surface including a profile having height differences, thereby providing cavities and elevations having a predetermined maximum height difference, includes providing a transmissive layer in the cavities and on the elevations of the optical element, the transmissive layer having a first height in the cavities that is larger than the predetermined maximum height difference; and surfacing the transmissive layer after providing the transmissive layer such that the transmissive layer has a second height on the elevations that is substantially zero or larger, thereby providing a transmissive layer with a substantially flat surface in the cavities and over the elevations.

In another embodiment, the optical element is an EUV optical element and transmissive layer is an EUV transmissive layer.

In a further embodiment, the optical element is chosen to be at least one of a reticle, a multilayer mirror, a normal incidence mirror, a grazing incidence mirror, a filter, an aperture, a masking blades, a grating and an optical sensor.

In a still further embodiment, the optical element includes a mirror with a mirror surface with a tilted multilayer stack which is tilted with respect to the mirror surface, e.g. with a plurality of tilted multilayer stacks that are tilted with respect to the mirroring surface.

The transmissive layer, e.g. an EUV transmissive layer, may include a material selected from at least one of Be, B, C, Si, P, S, K, Ca, Sc, Br, Rb, Sr, Y, Zr, Nb, Mo, Ba, La, Ce, Pr, Pa and U. In this way the cavities are filled with an EUV transparent material, and an EUV transmissive layer is provided over, and in, the cavities and over the elevations. The layer may also include combinations of such EUV transparent materials. After providing the transmissive layer, this layer may be surfaced, for example by polishing, etching, etc.

Within practical limits of surfacing methods, the height after surfacing over the elevations (second height) may be substantially zero, e.g. practically zero due to a surfacing away of the transparent layer such that the layer above the elevations is substantially removed. The height over the elevations may be larger than zero, e.g. only a few nanometers up to 500 nm. Due to the surfacing after providing the layer, a transmissive layer is provided having a substantially flat surface. Such a substantially flat surface protects the optical element and enables easier cleaning of the optical element. The flat surface also enables more easy detection of contaminant particles, e.g. dust, by, for example, optical light microscopy.

In yet another embodiment, the transmissive layer, e.g. an EUV transmissive layer, includes a material or a combination of materials, e.g. silicon, which has a complex refractive index close to unity at the desired wavelength. When choosing a material for the transmissive layer having a complex refractive index close to unity at the desired wavelength (e.g. 13.5 nm), a redesign of the optical element may not be necessary because the vacuum has a complex refractive index of 1. When, in the case of an EUV transmissive layer, other materials (or combinations of materials that do not substantially include silicon) are chosen, a redesign may be necessary since those materials usually do not have a complex refractive index close to unity at the desired EUV wavelength.

In still another embodiment, the transmissive layer includes a material or a combination of materials that is different, or substantially different, from the material or combination of materials in which the elevations are provided.

In a still further embodiment, the transmissive layer is provided by chemical vapor deposition. Other methods for deposition include, for example, sputtering or atomic vapor deposition. Other methods for silicon deposition include, for example, plasma-enhanced chemical vapor deposition or hot-wire chemical vapor deposition. After applying chemical vapor deposition, or another technique for providing a transmissive layer in the cavities and over the elevations, the transmissive layer is surfaced, for example by techniques like polishing or etching.

In another embodiment, after surfacing the second height of the transmissive layer (e.g. an EUV transmissive layer) is, for example, up to approximately 500 nm, e.g. 1-100 nm and the transmissive layer has a roughness of approximately 0-50 nm, e.g. 0-10 nm or 0-2 nm. A transmissive layer, e.g. an EUV transmissive layer, having a roughness of approximately 50 nm or smaller is defined herein as being substantially flat.

The optical element may be used in a device manufacturing method. Hence, in another aspect of the present invention, a device manufacturing method includes projecting the patterned beam of radiation onto a target portion of the substrate and providing an optical elements according to the present invention.

Introducing an optical element including a substantially flat surface according to the present invention in a lithographic apparatus or in a device manufacturing method protects the optical elements and also makes the optical elements easily cleanable.

Introducing an optical elements including a transmissive layer, e.g. an EUV transmissive layer, according to the present invention in a lithographic projection apparatus or a device manufacturing method provides an optical filter function as the EUV transmissive layer is transmissive for EUV wavelengths (radiation with wavelengths between about 5-20 nm, for example 13.5 nm), but substantially not transmissive for a part or all radiation which is undesired, for example UV and/or IR radiation. Hence, the present invention is also directed to an optical element and a method wherein the transmissive layer provides an optical filter function.

Also for wavelengths other than EUV wavelengths, for example non-EUV lithography or other optical applications, transmissive layers can be provided, wherein the transmissive layer includes materials or combinations of materials that are substantially transmissive for the desired wavelength, but substantially not transmissive for one or more other wavelengths, for example. transmissive for radiation having a wavelength of 193 nm and substantially non-transmissive for radiation having wavelengths in VIS and/or IR spectral regions.

According to a further aspect of the invention, an optical element includes at least one surface including a profile having height differences, thereby providing cavities and elevations having a predetermined maximum height difference, wherein the optical element further includes a substantially flat transmissive layer in the cavities and on the elevations of the optical element.

In an alternative arrangement thereof, the height of the transmissive layer in the cavities is substantially equal or larger than the predetermined maximum height difference, and a second height of the transmissive layer on the elevations is substantially zero or larger.

In another embodiment, the transmissive layer over the cavities and elevations has a roughness of approximately 0-50 nm, e.g. 0-10 nm or 0-2 nm. In a further embodiment, the second height is larger than zero, e.g. the second height is up to 500 nm. In still another embodiment, the transmissive layer has a roughness of 1-50 nm. In yet another embodiment, the second height is 10-500 nm.

In another aspect of the present invention, an optical element manufacturing method, wherein the optical element has at least one surface including a profile having height differences, thereby providing cavities and elevations having a predetermined maximum height difference, includes providing a transmissive layer in the cavities and on the elevations of the optical element, the transmissive layer having a first height in the cavities that is larger than the predetermined maximum height difference; and surfacing the transmissive layer after providing the transmissive layer such that the transmissive layer has a second height on the elevations that is substantially zero or larger, thereby providing a transmissive layer with a substantially flat surface in the cavities and over the elevations.

According to yet another aspect of the present invention, a lithographic apparatus includes an illumination system configured to provide a beam of radiation; a support configured to support a patterning device, the patterning device configured to impart the beam with a pattern in its cross-section; a substrate table configured to hold a substrate; a projection system configured to project the patterned beam onto a target portion of the substrate; and an optical element, wherein the optical element is an optical element according to the present invention.

In an embodiment, the optical element has at least one surface including a profile having height differences, thereby providing cavities and elevations having a predetermined maximum height difference.

In another embodiment, the optical element further includes a substantially flat transmissive layer in the cavities and on the elevations of the optical element, and the optical element has a first height of the transmissive layer in the cavities that is substantially equal or larger than the predetermined maximum height difference, and a second height of the transmissive layer on the elevations that is substantially zero or larger.

According to a further aspect of the present invention, there is provided a device which is manufactured according to the device manufacturing method of the present invention.

In this specification, the term "optical element" means one or more optical devices or systems including, but not limited to, reticles, patterning devices, mirrors, multilayer mirrors, gratings and optical sensors, including image sensors. A lithographic apparatus having "an optical element" according to the present invention also includes a lithographic apparatus including other optical elements, including EUV optical elements. Optical elements have at least one surface including a profile having height differences. These height differences are due to the presence of protrusions on certain surfaces, for example laminarly arranged protrusions of a grating on a multilayer mirror, chromium protrusions forming a pattern on a substrate in case of a reticle, or marker patterns on an image sensor, etc. The height of these protrusions is usually defined with respect to the surface on which the protrusions are present. Herein, the term "protrusions" and "elevations" are synonymous.

These protrusions or elevations form a "profile", for example regularly, like a grating, and provide on the surface of such optical elements "cavities" (i.e. areas which are deeper with respect to adjacent areas), and which can be seen as the area, two dimensionally speaking, between protrusions or elevations (areas which are higher with respect to adjacent areas).

Usually, the protrusions are flat and have equal heights. The cavities are also usually flat and have equal depths (i.e. are thus usually equal to the height of the protrusions). This means that the height of the protrusions is a predetermined maximum height difference. In case the protrusions and cavities are not flat, the maximum height difference between the bottom (surface) of the cavities and the top surface of the elevations is the predetermined maximum height. In general the maximum height difference between the top surface of the elevation and the bottom surface of the cavity may be determined and is the "predetermined maximum height difference".

In the context of the present invention, "first height" means the height in the cavities which is obtained after providing a transmissive layer in the cavities and on the elevations of the optical elements, but before surfacing. Due to a subsequent surfacing procedure, the first height is reduced such that a height in the cavities is obtained that is larger than the predetermined maximum height difference. Further, the term "second height" refers to the height of the transmissive layer, e.g. an EUV transmissive layer, on the elevations that is obtained after surfacing, e.g., polishing.

"Substantially zero" as used herein means that the height of the layer above the protrusions or elevations (i.e. second height) may be reduced, within practical limits of surfacing methods, to substantially zero, e.g. a few nanometers or less. Before surfacing the transmissive layer, the transmissive layer in the cavities has a first height. When surfacing, e.g. polishing or etching, the height of the transmissive layer is reduced, and thus the first height is reduced too, such that the second height on the elevations, that is obtained after surfacing, is substantially zero or larger. When the height of the transmissive layer is reduced until the height over the elevations (second height) is substantially zero, the first height is also reduced, resulting in a final height in the cavities that is "substantially equal" to the predetermined maximum height difference. When the layer height in the cavity is substantially equal to the predetermined maximum height difference, there may be a difference of only a few nanometers or less between these heights.

The phrase "a substantially flat surface in the cavities and over the elevations" as used herein describes the situation that a substantial continuous transmissive layer is present on at least part of the optical element, thereby providing such layer in the cavitities and on the elevations.

"Transmissive" or "substantially transmissive" as used herein means that the transmission through a transmissive layer, e.g. an EUV transmissive layer, is larger than zero, preferably at least 30%, or at least 50%, at least 70%, at least 80%, at least 90% or at least 95%, more preferably at least 98%. Since the radiation usually travels through the transmissive layer, e.g. in the cavity, especially the transmissive layer in the cavity after surfacing is transmissive with above-mentioned meaning.

"Not absorbed" or "substantially not absorbed" as used herein means that the absorption of radiation is less than 100%, preferably less than 70%, or less than 50%, or less than 30%, less than 20%, less than 10% or less than 5%, more preferably less than 2%.

"Undesired radiation" or "undesired wavelength" refers to radiation having wavelengths larger or smaller than the wavelength that is intended to be used. For example, when EUV radiation with a wavelength of about 13.5 nm is desired, radiation with a wavelength smaller than about 10 nm or larger than about 20 nm is not desired.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion," respectively. Further, the substrate referred to herein may be processed, before or after exposure, in for example a track (a tool that typically applies a resist to a substrate and develops the exposed resist) or a metrology or inspection tool. Where applicable, the disclosure herein may be applied to such and other substrate processing tools.

The terms "radiation" and "beam" as used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams, but especially EUV radiation (e.g. having a wavelength in the range of 5-20 nm).

The term "patterning device" as used herein should be broadly interpreted as referring to a device that can be used to impart a beam of radiation with a pattern in its cross-section such as to create a pattern in a target portion of the substrate. It should be noted that the pattern imparted to the beam might not exactly correspond to the desired pattern in the target portion of the substrate. Generally, the pattern imparted to the projection beam will correspond to a particular functional layer in a device being created in the target portion, such as an integrated circuit.

Patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. In this manner, the reflected beam is patterned. In each example of a patterning device, the support may be a frame or table, for example, which may be fixed or movable as required and which may ensure that the patterning device is at a desired position, for example with respect to the projection system. Any use of the terms "reticle" or "mask" herein may refer to any patterning device with a non-planar surface providing elevations and cavities.

The term "projection system" as used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
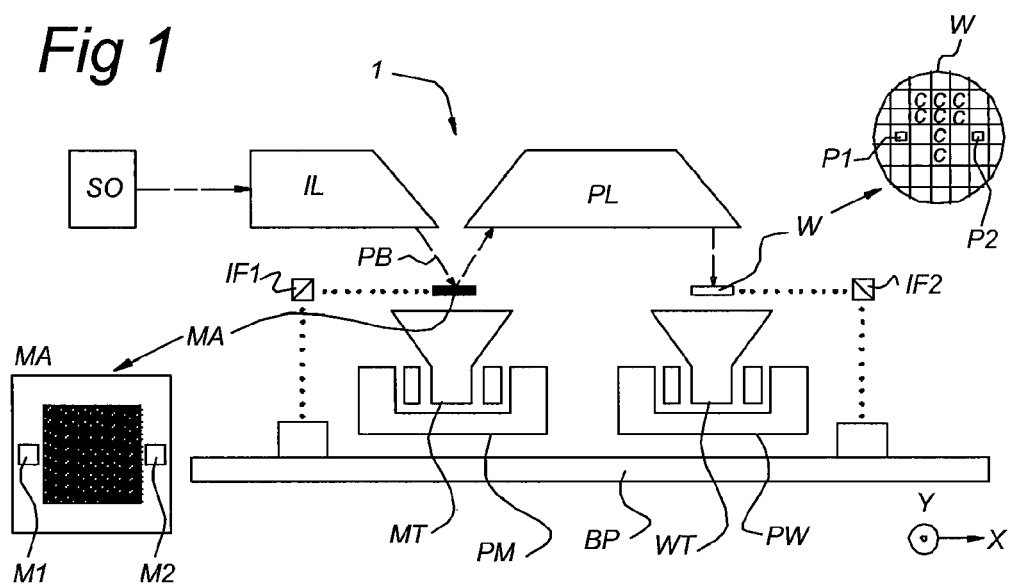
FIG. 1 schematically depicts a lithographic apparatus according to an embodiment of the present invention.

FIG. 1 schematically depicts a lithographic apparatus 1 including an illumination system (illuminator) IL configured to provide a beam of radiation PB (e.g. UV or EUV radiation). A first support (e.g. a mask table) MT supports a patterning device (e.g. a mask) MA and is connected to a first positioning device PM that accurately positions the patterning device with respect to a projection system ("lens") PL. A substrate table (e.g. a wafer table) WT holds a substrate (e.g. a resist-coated wafer) W and is connected to a second positioning device PW that accurately positions the substrate with respect to the projection system PL. The projection system (e.g. a reflective projection lens) PL images a pattern imparted to the beam PB by patterning device MA onto a target portion C (e.g. including one or more dies) of the substrate W.

As here depicted, the apparatus is of a reflective type (e.g. employing a reflective mask or a programmable mirror array of a type as referred to above), but the present invention is also directed to elements in a transmissive system, or systems including both reflective and transmissive elements.

The illuminator IL receives radiation from a radiation source SO. The source SO and the lithographic apparatus 1 may be separate entities, for example when the source is a plasma discharge source. In such cases, the source is not considered to form part of the lithographic apparatus and the radiation is generally passed from the source SO to the illuminator IL with the aid of a radiation collector including, for example, suitable collecting mirrors and/or a spectral purity filter. In other cases, the source may be integral part of the apparatus, for example when the source is a mercury lamp. The source SO and the illuminator IL may be referred to as a radiation system.

The illuminator IL may include an adjusting device(s) to adjust the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation PB having a desired uniformity and intensity distribution in its cross-section.

The beam PB is incident on the mask MA, which is held on the mask table MT. Being reflected by the mask MA, the beam PB passes through the projection system PL, which focuses the beam onto a target portion C of the substrate W. With the aid of the second positioning device PW and a position sensor IF2 (e.g. an interferometric device), the substrate table WT can be moved accurately to position different target portions C in the path of the beam PB. Similarly, the first positioning device PM and a position sensor IF1 (e.g. an interferometric device) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper, as opposed to a scanner, the mask table MT may be connected to a short stroke actuator only, or may be fixed. Mask MA and substrate W may be aligned using mask alignment marks M1, M2 and substrate alignment marks P1, P2.

The depicted apparatus can be used in the following modes:

1. In step mode, the mask table MT and the substrate table WT are kept essentially stationary, while an entire pattern imparted to the projection beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width in the non-scanning direction of the target portion in a single dynamic exposure, whereas the length of the scanning motion determines the height in the scanning direction of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
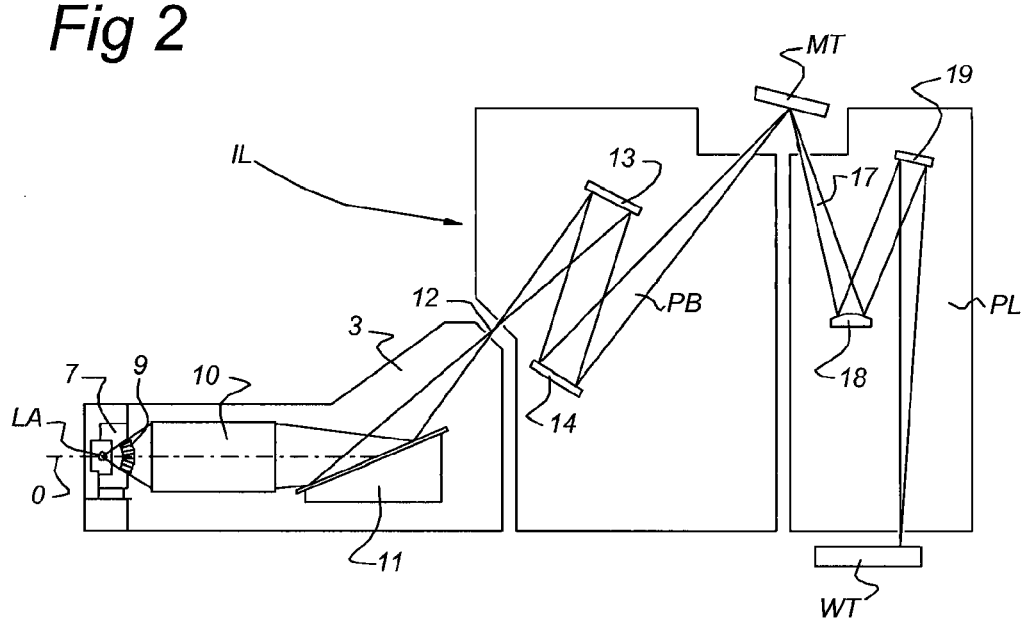
FIG. 2 schematically depicts a side view of an EUV illumination system and projection system of a lithographic projection apparatus according to FIG. 1.

FIG. 2 shows more details of the beam path through the lithographic projection apparatus 1 of FIG. 1, with a source-collector module 3, illumination system IL, and projection system PL. The source-collector module 3 includes the source SO, a radiation collector 10 which may be formed by a grazing incidence collector. Radiation passed by the radiation collector 10 is reflected off a grating spectral filter or mirror 11 to be focused in a virtual source point 12 at an aperture.

The source-collector module 3, including the radiation source SO, the illumination system IL and the projection system PL may be contained in respective compartments ("boxes") which are evacuated or flushed with a gas transparent to the radiation of the beam of radiation. The beam is passed between the different compartments through openings in their walls. The radiation source SO may employ a gas or vapor, such as Xe gas or Li vapor, in which a very hot plasma can be created by a discharge between electrodes of the radiation source to emit radiation in the EUV range of the electromagnetic spectrum. The very hot plasma is created by causing a partially ionised plasma of an electrical discharge to collapse onto an optical axis 0. Partial pressures of 0.1 mbar of Xe, Li vapor or any other suitable gas or vapor may be required for efficient generation of the radiation.

When xenon is used, the plasma may radiate in the EUV range around 13.5 nm. The radiation emitted by the radiation source SO may be led from a source chamber 7 to a contaminant barrier 9. The contaminant barrier 9 may include a channel structure such as, for instance, described in detail in European Patent Application Publication EP-A-1 057 079.

The beam PB is reflected in the illumination system IL via normal incidence reflectors 13, 14 onto a reticle or mask positioned on reticle or mask table MT. A patterned beam 17 is formed which is imaged in the projection system PL via reflective elements 18, 19 onto wafer stage or substrate table WT. More elements than shown may generally be present in illumination system IL and projection system PL.

Figure 3:
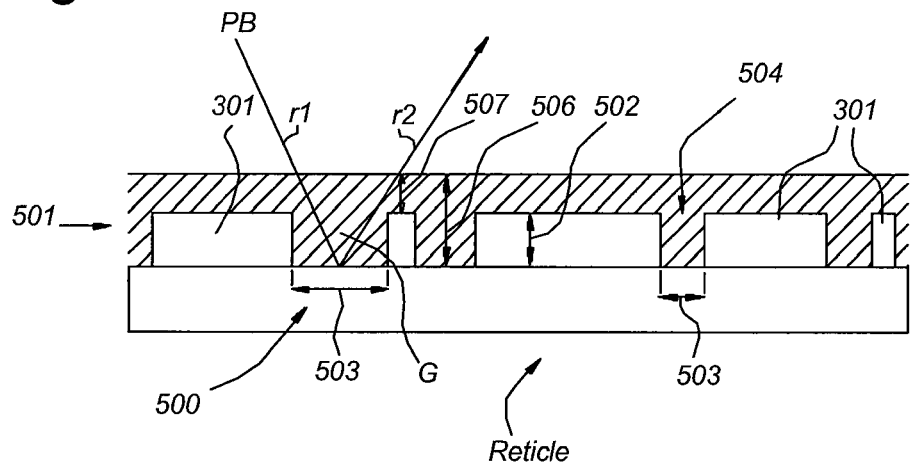
FIG. 3 schematically depicts a reticle having an EUV transmissive layer according to an embodiment of the present invention.

For example, the reticle or mask MA on mask table MT in FIGS. 1 and/or 2 can be a reticle with an EUV transmissive layer according to the invention. Such a reticle is schematically depicted in FIG. 3. The reticle includes a substrate 500, for example a quartz substrate. Protrusions 301 are present on the substrate 500 of the reticle and form a pattern 501. These protrusions 301 include, for example, chromium or TaN (e.g. 50-100 nm high) and form the patterned absorber or pattern 501. Further, reticles may usually include a reflective layer (e.g. Mo/Si multilayer) and a patterned buffer layer (e.g. SiO$_2$), which are not shown in the schematic drawing of FIG. 3. Due to the presence of the protrusions 301 on the reticle, elevations 301 and cavities G are created. In FIG. 3, the elevations are the protrusions 301 and the cavities G are the grooves between the protrusions 301.

The protrusions 301 on the reticle form the pattern 501 and have a height 502. The distance 503 between the protrusions 301 may vary due to the kind of pattern 501 that is desired (and depends on the desired wafer/device). A characteristic height 502 for the protrusions, of for example chromium, on the reticle is about 50-100 nm. This is the predetermined maximum height. Note that FIG. 3, as well as the other figures in this application, is a two dimensional figure and is not to scale.

The reticle is provided with a transmissive layer on and in between the protrusions 301. According ton this embodiment the transmissive layer is an EUV transmissive layer 504. This may be done by chemical vapor deposition, or other techniques. After providing this transmissive layer in the cavities G and over the elevations 301, the height of the layer in the cavities is larger than the predetermined maximum height. Subsequently, the transmissive layer 504 is surfaced, e.g. by polishing, leading to a reduction in layer height. FIG. 3, as well as the next figures, shows the optical element after surfacing.

The EUV transmissive layer 504 has a second height 507 on/above the protrusions 301 and a first height 506 above the substrate 500 of the reticle. This means that the groove or cavity G is provided with an EUV transmissive layer with the first height 506. The height 507 is the second height.

In this way, a reticle is obtained that has a substantially flat surface. Due to this flat surface, the reticle is protected against damages. However, the flat EUV transmissive layer also enables one to clean the reticle without damaging the reticle and the protrusions 301. Additionally, the EUV transmissive layer 504 may also provide an optical filter function, due to the fact that the EUV transmissive layer 504 is transparent for EUV radiation but radiation having other wavelengths than EUV radiation may be absorbed or refracted by the EUV transmissive layer 504. Assuming a reflective reticle, ray r1 of beam PB travels through the EUV transmissive layer 504 and is reflected at the substrate into ray r2.

The EUV transmissive layer 504 may includes silicon (Si). Silicon has an complex index of refraction close to unity. This means that the EUV transmissive layer is invisible to EUV radiation, and an EUV transmissive layer including silicon can be applied without the necessity of using a reticle that is redesigned because of reflection characteristics changed by the EUV transmissive layer 504. Rays r1 and ray r2 travel undisturbed (i.e. substantially unrefracted and substantially not absorbed) through the EUV transmissive layer 504. When other materials are used for the EUV transmissive layer 504, e.g. B, C, Mo, Nb, Si, $Si_3N_4$, $B_4C$ or SiC, the use of a reticle redesigned to the optical properties, for example EUV absorption and EUV refractive index of the EUV transmissive layer to be applied, may be necessary.

Figure 6:
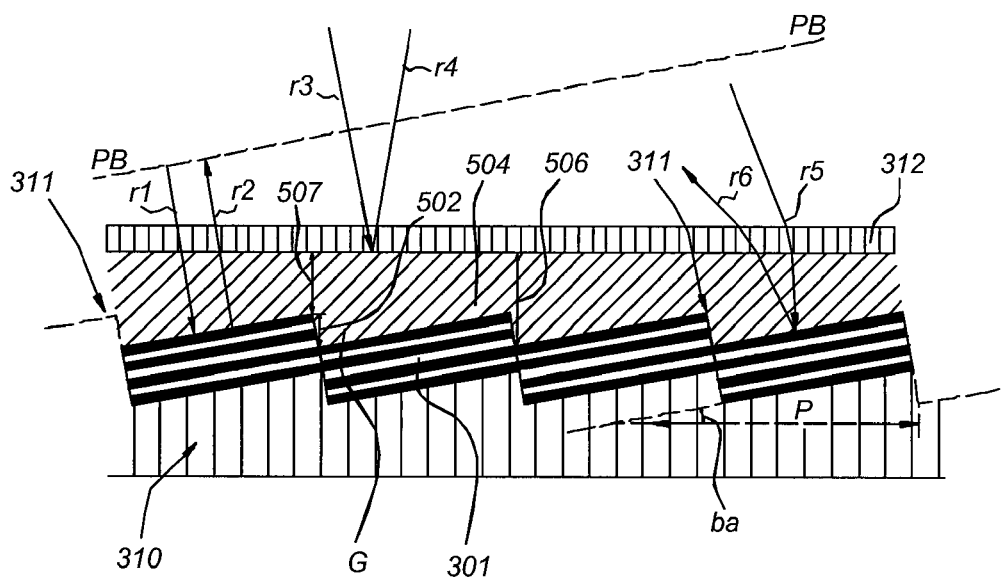
FIG. 6 schematically depicts a mirror with a tilted multilayer stack and an EUV transmissive layer on top of the stack.

When desired, the EUV transmissive layer 504 may be coated with another protective layer, e.g. a thin Ru layer (not shown in FIG. 3, but such a layer is shown in FIG. 6 as layer 312 on EUV transmissive layer 504) of about up to 10 nm.

It should be appreciated that for other reticle types, e.g. phase-shift masks, which have a plurality of elevations relative to the mask substrate 500 and cavities G in between these elevations, the method of the invention may also be used.

U.S. Pat. No. 6,678,037 describes a mirror with a grating structure. As shown and described in FIGS. 3 and 4 of that document, the protrusions are formed entirely of silicon.

In an embodiment of the present invention, a mirror with a grating structure is similar to the mirror shown and described in U.S. Pat. No. 6,678,037. However, according to the embodiment of the present invention, the protrusions are not entirely of silicon, but substantially include another material, or combinations of materials. The mirror with the grating structure in this embodiment is described as an EUV optical element, but this embodiment is not limited to EUV applications.

Figure 4:
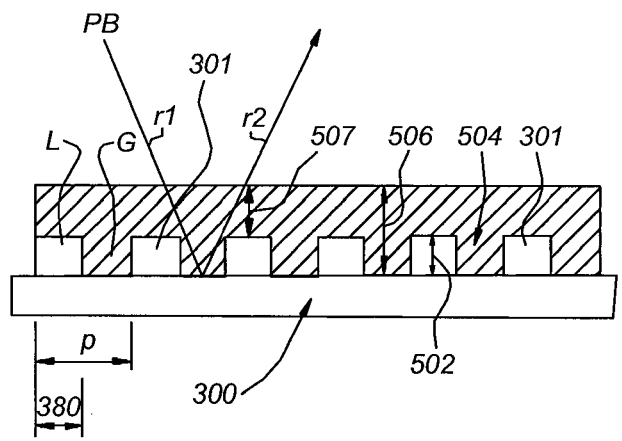
FIG. 4 schematically depicts a mirror with protrusions on mirror surface in a form of a laminar square wave profile.

By way of example, this embodiment is schematically depicted in FIG. 4. A mirror 300 is shown having protrusions 301, and the protrusions form a laminar square wave profile. The protrusions have a period p, a length 380, and a height 502. Height 502 is the predetermined maximum height and all protrusions 301 have the same height. Reference L refers to "land" and reference G refers to "groove". The protrusions 301 include, for example, EUV absorbers like Cr or TaN, or a Si/Mo multilayer. However, transmissive materials like Zr, creating a phase difference, can also be used. The cavities, or grooves, G are, according to the invention, filled with an EUV transmissive layer 504 with height 506. The height of the EUV transmissive layer 504 above the elevations or protrusions 301 is indicated with reference 507 (second height).

EUV transmissive layer 504, as shown in FIG. 4, may be provided by chemical vapor deposition of an EUV transmissive material, for example silicon. After providing this layer in the cavities and on the elevations, the EUV transmissive layer is polished, such that an EUV transmissive layer is obtained with height 507 above the elevations or protrusions 301, or height 506 above the cavities or grooves G.

The mirror 300 of to FIG. 4 may be used as grating, wherein the grating is used to select the desired wavelength and the EUV transmissive layer provides a protective layer which can easily be cleaned, and also provides an optical filter function by transmitting EUV radiation and absorbing part of the non-EUV radiation. The EUV transmissive layer 504 may include a material selected from at least one of Be, B, C, Si, P, S, K, Ca, Sc, Br, Rb, Sr, Y, Zr, Nb, Mo, Ba, La, Ce, Pr, Pa and U. The EUV transmissive layer 504 may also include a combination of two or more of these materials. The appropriate materials for the EUV transmissive layer 504 and the protrusions 301 may be chosen.

In an alternative arrangement, the EUV transmissive layer 504 includes a material with a complex index of refraction close to unity, for example silicon. By choosing such a material for the EUV transmissive layer 504, a redesign of the grating is not necessary, since the EUV transmissive layer 504 is invisible for the EUV radiation as described above. The EUV radiation of the beam PB may travel substantially undisturbed through EUV transmissive layer 504, since this layer is substantially transmissive for EUV radiation, and in the case of silicon also has a complex index of refraction close to unity. This is shown by way of example in FIG. 4, where ray r1 of beam PB travels through the EUV transmissive layer and is reflected at the mirror 300 into ray r2, without being refracted. In case materials or combinations of materials are chosen that have a complex index of refraction not close to unity, rays r1 and r2 may be refracted, which may mean that a redesigned grating structure has to be used.

FIG. 4 depicts a mirror with a grating structure having a laminar square wave profile. However, it should be appreciated that this embodiment may alternatively relate to a mirror with a sawtooth profile having an EUV transmissive layer, as well as two dimensional gratings having such an EUV transmissive layer.

The grating shown in FIG. 4, or other gratings which are included in this embodiment, may be used as the normal incidence reflectors 13 and/or 14 and/or as the reflective elements 18 and/or 19 of the lithographic projection apparatus of FIG. 2.

Although not shown in FIG. 4, it should be appreciated that gratings like those schematically depicted in FIG. 4 may be used on curved mirrors. Also such curved mirrors may include a grating structure with an EUV transmissive layer 504.

When desired, the EUV transmissive layer may be coated with another protective layer (not shown in FIG. 4, but such a layer is shown in FIG. 6 as layer 312 on EUV transmissive layer 504), e.g. a thin Ru layer of about up to 10 nm.

Figure 5:
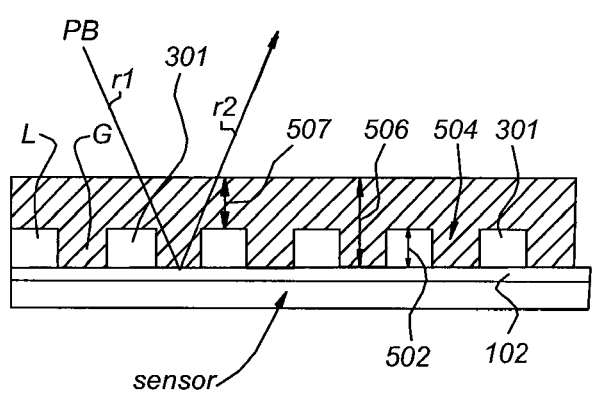
FIG. 5 schematically depicts a cross section of an image sensing device of a lithographic projection apparatus.

Referring to FIG. 5, an image sensor is shown having an EUV transmissive layer. Image sensors are known from the art, see for example U.S. Pat. No. 6,747,282. An image sensor can be used for measuring the aerial image of a pattern on a mask that is provided on mask table MT. Such a measurement allows determining projection system aberrations, projection system magnification, and the focus plane of the projection system, but also allows alignment of substrate table WT and mask pattern (mask table MT).

In FIG. 5, an image sensor is schematically depicted, the image sensor having a sensor or sensor plate, indicated with reference "sensor". The image sensor may be based on diode technology, e.g. silicon photodiodes. Silicon photodiodes are semiconductor devices that are responsive to photons. Photons are absorbed and create electron-hole pairs to generate a flow of electrical current in an external electrical circuit, proportional to the incident power. Photodiodes can be used to detect the presence or variations in minute quantities of light and can be calibrated for extremely accurate measurements of intensities having a dynamic range of eleven orders of magnitude.

The image sensor may further include a thin layer 102 of 1 to 10 μm silicon, e.g. epitaxially grown. Marker patterns (i.e. elevations or protrusions) 301 are present on the sensor and can be provided by using known lithographic projection techniques to define such marker patterns. The patterned metal layer above the photodiodes selectively passes EUV radiation to the photodiodes according to the pattern of the markers.

The presence of marker patterns 301 provides elevations or protrusions 301 that define lands L and cavities or grooves G, wherein the protrusions have a height 502 (predetermined maximum height). On top of the protrusions 301, the EUV transmissive layer 504 is present with height 507, and in the cavities or grooves G the EUV transmissive layer 504 is present with height 506. In this way, an EUV transmissive layer 504, having a substantially flat surface, may be provided on the image sensor 100.

In another variation of this embodiment, the EUV transmissive layer 504 includes a material with a complex index of refraction close to unity, for example silicon. By choosing such a material for the EUV transmissive layer 504, a redesign of the image sensor is not necessary, since the EUV transmissive layer 504 is invisible for the EUV radiation as described above. The EUV radiation of beam PB may travel substantially undisturbed through EUV transmissive layer 504, since this layer is substantially transmissive for EUV radiation, and in case of silicon also has a complex index of refraction close to unity. This is shown by substantially unrefracted rays r1 of beam PB and r2.

When desired, the EUV transmissive layer 504 may be coated with another protective layer (not shown in FIG. 4, but such a layer is shown in FIG. 6 as layer 312 on EUV transmissive layer 504), e.g. a thin Ru layer of about up to 10 nm.

FIG. 6 depicts a blazed grating as a mirror with a tilted multilayer stack and an EUV transmissive layer on top of this stack. Tilted multilayer mirrors, without the EUV transmissive layer of the present invention, and their production are known, for example from Seely et al., Applied Optics 40, vol. 31, page 5565 (2001).

In FIG. 6, the multilayer surface is tilted, and a kind of tilted stack structure of multilayers is created, with protrusions 301 of multi layers (e.g. Si and Mo multi layers), with period p, and blaze angle ba. The tilted multi layer stack of protrusions 301 may be present on, for example, a substrate or holder 310. The protrusions or elevations 301 of multi layers form elevations with varying heights. Hence, the maximum height of a protrusions is indicated by elevation top 311. Further, cavities or grooves G are present. Here, the height difference between the bottom of the cavity G and the top 311 of protrusions 301 is height 502 (predetermined maximum height difference).

Over the cavities G and protrusions or elevations 301, an EUV transmissive layer 504 is present. The height 507 of this EUV transmissive layer 504 is calculated from elevation top 311, and height 506 is calculated from the bottom of cavities or grooves G.

When desired, an extra layer 312 may be present, for example to provide an extra protection or an extra optical filter function. This extra layer 312 is not only applicable in this embodiment, but may also be applied in the previous embodiments. Such layer may include Ru.

The EUV transmissive layer 504, e.g. of silicon, may be provided by chemical vapor deposition, thereby providing an EUV transmissive layer 504 with a height larger than 502, followed by a surfacing (e.g. polishing) procedure. In this way a multilayer mirror is provided which can reflect EUV radiation, and which may deflect, reflect and/or absorb non-EUV radiation. For example ray r1, which is radiation having an EUV wavelength (e.g. 13.5 mm, desired radiation) of beam PB, propagates undisturbed or substantially undisturbed through layer 312 and EUV transmissive layer 504 and is reflected on protrusion 301 of the tilted multilayer stack into ray r2. Taking into account diffraction of the radiation from the beam PB by the grating (not depicted in FIG. 6), the angle of incidence with which the beam reaches the surface of this tilted multilayer and/or the blaze angle ba can be chosen, thereby determining the direction in which ray r2 is reflected.

Radiation having wavelengths other than EUV wavelengths, e.g. VIS or IR, is reflected at the surface of layer 312 (this reflection is not shown), or reflected at the surface of the EUV transmissive layer 504. This is shown in FIG. 6 by ray r3, which is a ray with a non-EUV wavelength which is reflected at the surface of the EUV transmissive layer 504 as ray r4.

Part or all of the radiation may also be transmitted through layer 312, or through EUV transmissive layer 504, or through both layers. However, due to the differences of index of refraction between the materials (including vacuum) on both sides of the interfaces, ray r5, being a ray of beam PB having a non-EUV wavelength, is refracted. Due to this refraction, rays r5 and r6 (ray r5 reflected at a multilayer stack protrusion 301) are refracted as indicated in FIG. 6.

Since the EUV transmissive layer 504 is transmissive for radiation having EUV wavelengths, but is substantially not transmissive for radiation having non-EUV wavelengths, part of the radiation having non-EUV wavelength may also be absorbed. As a result of the reflection, refraction and absorption, radiation having non-EUV wavelengths is diminished in the direction in which ray r2, which has EUV wavelength, is reflected. Diffraction is not taken into account in the schematic drawing of FIG. 6. In this way, an optical filter is obtained with a substantially flat surface, having the advantage of being easily cleaned and the advantage of providing an optical filter for EUV radiation (e.g. 13.5 mm).

It should be appreciated that generally (this also applies to the other embodiments), in case there would be a range of predetermined maximum height differences 502, then the predetermined maximum height difference would be the height difference 502 between the deepest cavity and highest elevation or protrusion 301. Further, it should be appreciated that in such case a layer height 507 of the EUV transmissive layer on the elevations larger than zero, after surfacing, will generally be defined with respect to the top 311 of the highest elevation or protrusion 301, thereby providing a flat EUV transmissive layer over the protrusions and cavities.

It should be appreciated that the present invention is also applicable to curved optical elements, the optical elements having a profile having height differences on curved surfaces, like curved mirrors or curved mirrors with grating structures, thereby taking into account that the transmissive layer will generally have the same curvature.

Figure 7:
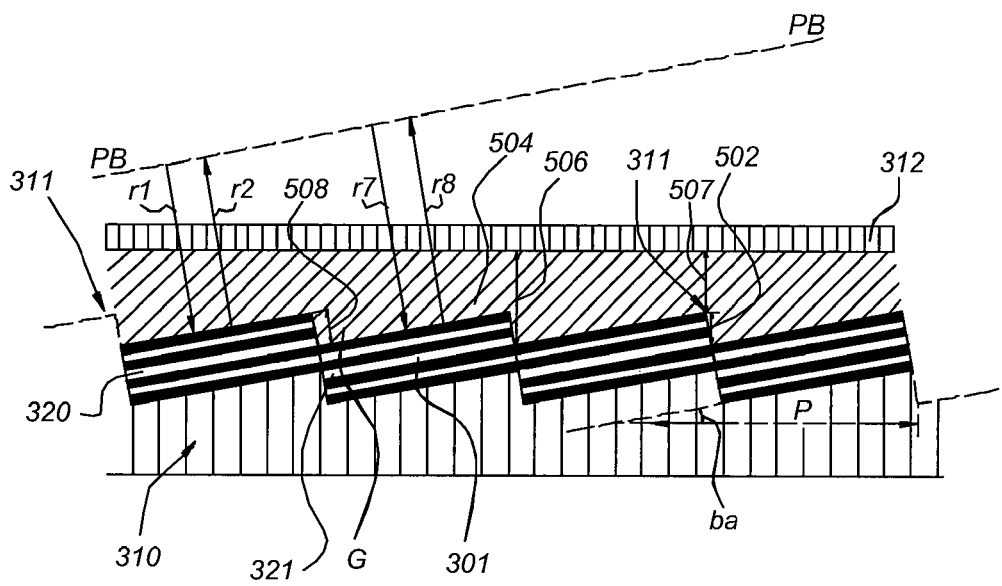
FIG. 7 schematically depicts the mirror of FIG. 6 in use.

Referring to FIG. 7, a blazed grating is used as a mirror with a tilted multilayer stack and an EUV transmissive layer on top of the stack, i.e. the tilted multilayer is acting as a mirror, and not as a grating, i.e. only having a zero$^{th}$-order. This is the case when the optical path length of a ray r1 impinging on a certain part of the multilayer stack 320 (a first protrusion 301) differs only an integer times the wavelength from the optical path length of a ray r7 impinging on an adjacent part of the multilayer stack 321 (a second protrusion 301). FIG. 7 shows this situation, where the optical path length is depicted for two reflected rays r1 and r7, respectively. Note that the dotted line is perpendicular to the rays r1, r7 and that the position of this line along the ray is arbitrary. Possible refraction for rays r1 and r7 on the surface, either the surface of optional layer 312 and/or on transmissive layer 504, is not taken into account since the index of refraction for EUV radiation may be very close to unity.

The height 508 is the height of a top 311 of a first protrusion (part of stack 320) relative to the bottom of the cavity G, but unlike the height 502, parallel to the side of part of the stack 320 (i.e. in this figure also parallel to rays r1 and r7). Teight 508 is perpendicular to the surface of the multilayer stack (protrusion 301). The expression for height 508 in this embodiment is:

$$h = \frac{m \times \lambda}{2},$$

wherein m is an integer.

In this embodiment, describing an optical element including a blazed grating as a mirror with a tilted multi layerstack and an EUV transmissive layer on top of this stack, the optical element is used as mirror, advantageously reflecting desired EUV radiation, and filtering and defracting radiation with wavelengths that is not desired. Hence, the transmissive layer provides an optical filter function.

In a variation on this embodiment, instead of rays r1 and r7 impinging perpendicular on the surface of protrusion 301 (parts of stack 320 and 321, respectively), a deviation of larger than 0° and smaller than or equal to about 20° is chosen, preferably between about 1 and 10°, e.g. about 5°. As will be appreciated, the above mentioned condition now obtains an angle-dependent part. However, the condition of r1 differing only an integer times the wavelength from the optical path length of a ray r7 still applies, thereby providing an optical filter function, filtering away at least part of radiation having wavelengths that are not desired.

Referring to FIGS. 6 and 7, a stacked multilayer mirror includes protrusions 301 (e.g. parts of stack 320 and 321 in FIG. 7, respectively) and may include 1-100 double layers, e.g. 40-60 double layers. The multilayers may include alternating Si and Mo layers, wherein the Mo layers have a layer height of about 1-3 nm, e.g. 2.5 nm, and wherein the Si layers have a layer height of about 3-6 nm, e.g. about 4.4 nm (both in the order of about a quarter of the wavelength). The height 507, the height of EUV transmissive layer 504, as calculated from the top of the elevation 311, may be about 10-500 nm, preferably be about 50-400 nm. Assuming that top layer 312 is not present, the roughness of the surface of EUV transmissive layer 504 may be 0-50 nm, e.g. 1-50 nm. The transmissive layer 504 may include Si.

While specific embodiments of the present invention have been described above, it will be appreciated that the invention may be practiced otherwise than as described. The description is not intended to limit the invention. Especially, the invention is directed to all optical elements that have regular or irregular non-flat surfaces with sub-micron elevations and cavities (e.g. heights or widths or both heights and widths of the cavities and elevations smaller than 1000 μm, e.g. 800 or 500 μm, or smaller), in which the method of the invention is used in order to equalize such surfaces by filling the cavities and coating the elevations with a transmissive layer, that is extending over the cavities and elevations, thereby providing a flat protective surface.

Further, the embodiments especially describe EUV applications and EUV optical elements. However, the invention can also be applied to optical elements for other spectral ranges, like e.g. UV or VIS. Further, the drawings schematically depict elements and features necessary to understand the invention. The invention is not limited to those elements shown in the schematic drawings.

What is claimed is:

1. An optical element, comprising:
   a surface comprising a tilted profile having height differences, thereby providing cavities and elevations having a predetermined maximum height difference; and
   a transmissive layer that covers the cavities and the elevations of the optical element, wherein a first height of the transmissive layer in the cavities is substantially equal or larger than the predetermined maximum height difference and the transmissive layer has a second height on the elevations and the second height is about 10-500 nm,
   wherein the transmissive layer is enabled to optically filter incident radiation, and
   wherein the optical element is a grating.

2. The optical element according to claim 1, wherein the transmissive layer is substantially planar.

3. The optical element according to claim 1, wherein the transmissive layer has a roughness of 0-50 nm.

4. The optical element according to claim 1, wherein the transmissive layer comprises a material selected from Be, B, C, Si, P, S, K, Ca, Sc, Br, Rb, Sr, Y, Zr, Nb, Mo, Ba, La, Ce, Pr, Pa and U and combinations thereof.

5. The optical element according to claim 1, wherein the grating comprises a mirror with a mirror surface and a multilayer stack which is tilted with respect to the mirror surface.

6. The optical element according to claim 1, wherein the transmissive layer comprises a material with a complex index of refraction.

7. The optical element according to claim 1, wherein the optical element is an EUV optical element and the transmissive layer is an EUV transmissive layer.

8. The optical element according to claim 1, further comprising:
   a capping layer formed on top of the top surface of the transmissive layer, wherein the capping layer is configured to provide protection to the optical element or provide optical filtering, or both.

9. The optical element according to claim 8, wherein the capping layer includes ruthenium.

10. A lithographic apparatus, comprising:
    an illumination system configured to provide a beam of radiation;
    a support configured to support a patterning device, the patterning device configured to impart the beam of radiation with a pattern in its cross-section;
    a substrate table configured to hold a substrate;
    a projection system configured to project the patterned beam onto a target portion of the substrate; and
    an optical element comprising a tilted multilayer stack comprising a profile having height differences, thereby providing cavities and elevations having a predetermined maximum height difference; and a transmissive layer in at least the cavities of the optical element, wherein a first height of the transmissive layer in the cavities is substantially equal or larger than the predetermined maximum height difference and the transmissive layer has a second height on the elevations and the second height is about 10-500 nm,
    wherein the transmissive layer is enabled to optically filter radiation, and
    wherein the optical element is a grating.

11. The apparatus according to claim 10, wherein the transmissive layer is substantially planar.

12. The apparatus according to claim 10, wherein the transmissive layer has a roughness of 0-50 nm.

13. The apparatus according to claim 10, wherein the transmissive layer comprises a material selected from Be, B, C, Si, P, S, K, Ca, Sc, Br, Rb, Sr, Y, Zr, Nb, Mo, Ba, La, Ce, Pr, Pa and U and combinations thereof.

14. The apparatus according to claim 10, wherein the grating comprises a mirror with a mirror surface and the multilayer stack is tilted with respect to the mirror surface.

15. The apparatus according to claim 10, wherein the transmissive layer comprises a material with a complex index of refraction.

16. The apparatus according to claim 10, wherein the optical element is an EUV optical element and the transmissive layer is an EUV transmissive layer.

* * * * *